United States Patent

Gill et al.

[15] 3,688,132

[45] Aug. 29, 1972

[54] A HIGH FREQUENCY INTEGRATED CIRCUIT HAVING CIRCUIT ELEMENTS IN SEPARATE AND MUTUALLY SPACED ISOLATION REGIONS

[72] Inventors: Brian Gill, 10 Matthews St., Reigate; Kenneth William Moulding, 51 Behams Dr., Horley, both of England

[22] Filed: Aug. 13, 1970

[21] Appl. No.: 63,433

[30] Foreign Application Priority Data

Sept. 11, 1969 Great Britain..........44,951/69

[52] U.S. Cl...................................307/303, 317/235

[51] Int. Cl...........................H03k 17/00, H01l 19/00

[58] Field of Search...................317/234, 235, 235 E

[56] References Cited

UNITED STATES PATENTS

| | | | |
|---|---|---|---|
| 3,278,853 | 10/1966 | Lin | 317/235 X |
| 3,309,537 | 3/1967 | Archer | 317/235 X |
| 3,379,940 | 4/1968 | Nakao | 317/235 |
| 3,448,344 | 6/1969 | Schuster et al. | 317/101 |
| 3,518,449 | 6/1970 | Chung | 307/215 |
| 3,567,965 | 3/1971 | Weinerth | 307/303 |
| 3,595,715 | 7/1971 | Thire et al. | 148/175 |

*Primary Examiner*—James D. Kallam
*Attorney*—Frank R. Trifari

[57] ABSTRACT

A semiconductor integrated circuit comprising a semiconductor layer having isolation regions forming *p-n* junctions with the adjacent regions of the layer. The isolation regions are contacted at one surface by electrical connections to which suitable potentials can be applied to reverse-bias p-n junctions between the isolation regions and the adjacent regions and mutually electrically isolate regions of circuit elements present in the layer.

13 Claims, 12 Drawing Figures

BRIAN GILL
K.W. MOULDING
INVENTORS
BY [signature]
AGENT.

BRIAN GILL
K. W. MOULDING
INVENTORS.

BY Frank R. Trifari
AGENT.

BRIAN GILL
K.W. MOULDING INVENTORS

BY Frank R. Trifari

AGENT.

BRIAN GILL
K.W. MOULDING
INVENTORS.

BY Frank R. Trifari
AGENT.

BRIAN GILL
K.W. MOULDING
INVENTORS.

BY [signature]
AGENT.

BRIAN GILL
K. W. MOULDING INVENTORS.

BY [signature]
AGENT.

A HIGH FREQUENCY INTEGRATED CIRCUIT HAVING CIRCUIT ELEMENTS IN SEPARATE AND MUTUALLY SPACED ISOLATION REGIONS

This invention relates to semiconductor integrated circuits comprising a semiconductor layer portion, first and second semiconductor surface regions of the layer portion being mainly of one conductivity type and comprising regions of circuit elements of the integrated circuit. The invention further relates to circuit arrangements comprising such semiconductor integrated circuits.

In such known semiconductor integrated circuits, the first and second surface regions comprising regions of circuit elements may be electrically isolated from each other and from further regions of the layer portion, in operation of the circuit, by so-called "p - n junction isolation", namely by reverse-biasing p - n junctions between the surface regions and a common semiconductor isolation region of the opposite conductivity type, for example p - type. The isolation region extends into the layer portion from one surface thereof and forms a closed figure at the one surface bounding the first and second surface regions and extending towards the periphery of the layer portion. The layer portion is usually an epitaxial layer originally of the n - type on a p - type semiconductor substrate with the p - type isolation region and the first and second surface regions extending throughout the thickness of the layer from the said one surface to the interface between the layer and the substrate. Consequently, the first and second surface regions form semiconductor surface islands mainly of the n - type surrounded in a semiconductor body by the p - type isolation region and the p - type substrate which form p - n junctions with the islands. By reverse-biasing these p - n junctions in operation, the first and second surface island regions can be mutually electrically isolated.

FIGS. 1 through 6 are diagrammatic views representing the prior art generally.

A proposed integration of the circuit of FIG. 1 of the accompanying diagrammatic drawings and the circuit of FIG. 5 of the accompanying diagrammatic drawings to form such known semiconductor integrated circuits will now be described to illustrate problems that can arise with such p - n junction isolation.

FIG. 1 shows a known simple high frequency amplifier circuit, commonly called a "feed-back pair" and operated at a typical frequency of 100 Megahertz. The circuit comprises a first n-p-n input transistor $T_1$ with a collector resistor $R_1$ and a second n-p-n output transistor $T_2$ with a collector resistor $R_2$ and an emitter resistor $R_4$. There is a feed-back resistor $R_3$ from the emitter of transistor $T_2$ to the base of transistor $T_1$. The emitter of transistor $T_1$ is grounded, and the input signal $E_I$ is applied to the base of transistor $T_1$. The output signal $E_O$ is derived from the collector of transistor $T_2$.

In integrating the circuit of FIG. 1, the transistor $T_1$ and $T_2$ are isolated from the other circuit elements. The resulting integrated structure is shown diagrammatically in a plan view in FIG. 2 and in a cross-sectional view in FIG. 3. The structure comprises a monocrystalline silicon body 1 having a layer portion 2 on a p - type substrate 3. The layer portion 2 is divided into islands 4 mainly of the n - type. The layer portion 2 is formed originally as an n - type epitaxial layer grown on the p - type substrate 3, and is divided into the islands 4 by selective diffusion of an acceptor impurity such as boron into the free surface of the n - type layer to form the common p - type diffused isolation region 5. The common p - type isolation region 5 bounds the islands 4 and extends towards the periphery of the layer portion 2.

Semiconductor surface regions of the circuit elements are provided in the various islands as indicated in FIG. 2 and shown in FIG. 3. The transistors $T_1$ and $T_2$ are provided in separate islands 4. The emitter and base regions 8 and 9, and 11 and 12 of the transistors $T_1$ and $T_2$ and the regions of the resistors $R_1$, $R_2$, $R_3$ and $R_4$ are formed by selective diffusion of impurities into the surface of the islands 4 using conventional planar techniques. The collector 7 of transistor $T_1$ and the collector 10 of transistor $T_2$ are constituted by those parts of the islands 4 surrounding the diffused base regions 8 and 11 respectively.

In the usual manner, metal layer interconnections, for example connections 14, 15, 16, 17 and 18, are formed on a thin insulating and passivating silica layer 13 on the surface of the layer portion 2 and contact various regions through openings in the silica layer 13. The metal layer interconnection scheme has expanded contact areas, for example contact area A, situated towards the periphery of the layer portion 2 for external connection of the integrated circuit. This may be effected by bonding wires between the contact areas and terminal pins of the integrated circuit device header or other envelope.

To simplify the drawings, the various regions of the circuit elements, the silica layer 13 on the layer portion surface and the metal layer interconnection pattern and contact areas are not shown in FIG. 2.

In the operation of the integrated circuit, the islands 4 or in particular, the collector regions 7 and 10 of the input and output transistors $T_1$ and $T_2$, are mutually electrically isolated by connecting the substrate 3 and the isolation region 5 to the most negative, stable potential in the circuit, in this case ground potential, so as to reverse-bias p - n junctions 6 between the islands 4 and the substrate 3 and isolation region 5.

In the structure of FIGS. 2 and 3, ground potential is applied by contacting the common isolation region 5 with the metal layer connection 14 which contacts and grounds the emitter 9 of the input transistor $T_1$.

However, such p - n junction isolation gives rise to stray capacitances and associated currents. Of particular importance for high frequency or high gain operation of the circuit of FIG. 1, is the stray capacitance between the substrate 3 and the collector region 10 of the output transistor $T_2$ and designated $C_2$ in FIG. 4. $C_1$ represents the stray capacitance between the substrate 3 and the collector region 7 of the input transistor $T_1$. The stray capacitance $C_2$ of the output transistor $T_2$ is connected to the emitter of the input transistor $T_1$ by the common isolation region 5 which bounds both the island 4 associated with the output transistor $T_2$ and the island 4 associated with the input transistor $T_1$ and by the metal layer connection 14 which contacts both the common isolation region 5 and the emitter 9 of the input transistor $T_1$. The metal layer connection 14 has a contact area A which is connected to an external ground line E by a common lead L, which may comprise a wire and a terminal pin of the integrated circuit device envelope. The stray capacitance coupling results in signals developed across the common ground lead impedance with consequent undesirable feed-back from the output stage to the input stage of the circuit.

The capacitance current I associated with the coupling is given by the expression:

$$I = 2\pi f \cdot E_O C_2,$$

where $f$ is the frequency of operation and $E_O$ the output potential derived from the collector of the output transistor $T_2$.

This current $I$ flows to ground E through the common lead L which grounds the emitter of the input transistor $T_1$ as well as the common isolation region 5. The inductance L of this lead results in a potential $E_L$ being developed across the lead L and given by the expression:

$$E_L = 2\pi f \cdot I \cdot L.$$

$$= 4\pi^2 f^2 \cdot E_O \cdot L.C_2.$$

This is injected into the input stage, and with the circuit operating at high frequencies and/or high gain, this feed-back potential $E_L$ becomes significant and troublesome. Consequently, it is desirable with such an amplifier to eliminate, or at least substantially reduce, such troublesome feed-back.

This may be effected simply in the case of the simple amplifier circuit of FIG. 1 by replacing the metal layer connection 14 which contacts both the isolation region 5 and the emitter 9 by separate metal layer connections contacting the isolation region 5 and the emitter 9. These separate metal layer connections would each have a separate contact area $A_1$ and $A_2$ to which a separate ground leads $L_1$ and $L_2$ are connected.

However, such a simple solution is not effective in eliminating such troublesome feed-back when the output transistor $T_2$ forms part of the $N^{th}$ stage of a multi-stage high frequency amplifier, a circuit of which is indicated in FIGS. 5 and 6 of the accompanying diagrammatic drawings. The output transistor is now designated $T_N$, its collector resistor $R_N$ and its emitter resistor R.

The circuit of FIG. 5 is integrated in a monocrystalline silicon body 1 in a manner analogous to that of the circuit of FIG. 1. The circuit elements are provided in surface islands 4 of a layer portion 2 of the body 1; the layer portion 2 is situated on a p - type substrate 3 and is divided into the islands 4 mainly of n - type by a p - type isolation region 5 common to the islands 4 associated with both the input and output transistors $T_1$ and $T_N$ respectively.

The stray capacitance between the substrate 3 and the collector of the output transistor $T_N$ is designated $C_N$ in FIG. 6. One metal layer connection contacts the emitter 9 and has a contact area $A_1$ which is connected to the external ground line E by one lead $L_1$; another metal layer connection contacts the isolation region 5 and has a contact area $A_2$ which is connected to the external ground line E by another lead $L_2$.

As a result of the capacitive current associated with the stray capacitance $C_N$ of the output transistor $T_N$, a potential $E_L = 4\pi^2 f^2 \cdot E_O \cdot L_2 \cdot C_N$ is developed across the lead $L_2$. Since the isolation region 5 and the emitter of the input transistor $T_1$ have separate connections to ground, this signal is not fed to the emitter of the input transistor $T_1$. However, as shown in FIG. 6, the stray capacitance $C_1$ of the input transistor $T_1$ and the stray capacitance $C_N$ of the output transistor $T_N$ are interconnected by the common isolation region 5 which has a common ground lead $L_2$. Consequently, the feed-back signal can still be injected into the output stage through the stray capacitance coupling $C_1$. Such feed-back in a simple amplifier circuit such as is shown in FIG. 1 is usually insignificant, but in a multi-stage high frequency amplifier such as is shown in FIG. 5 such feed-back can be significant and troublesome and therefore undesirable.

According to a first aspect of the invention, a semiconductor integrated circuit comprises a semiconductor layer portion, first and second semiconductor surface region of the layer portion being mainly of one conductivity type and comprising regions of circuit elements of the integrated circuit, a first semiconductor isolation region bounding the first surface region, a second semiconductor isolation region bounding the second surface region, which first and second isolation regions are separate and mutually spaced, are of the opposite conductivity type and extend into the layer portion from one surface thereof, a first electrical connection contacting the first isolation region at said one surface, and a second electrical connection contacting the second isolation region at said one surface, whereby, in operation, suitable potentials can be applied to the first and second electrical connections to reverse-bias p - n junctions between the first and second isolation regions and the first and second surface regions and mutually electrically isolate the first and second surface regions.

Such an integrated circuit comprising first and second separate and mutually spaced isolation regions contacted by first and second electrical connection respectively provides a versatile structure that is capable of considerable application and exploitation by integrated circuit designers. Furthermore, in the manufacture of such integrated circuits, by appropriately designing the relevant photomasks used, the first and second isolation regions may be formed simultaneously, and the first and second electrical connections contacting the isolation regions may be formed simultaneously with other circuit connections; consequently, compared with corresponding known integrated circuits having a single common isolation region, no additional processing stages are necessary.

Of particular importance are integrated circuits according to the invention in which the first and second electrical connections are mutually independent. Each may be a separate metal layer connection and, in operation of the circuit, may be connected to separate sources of potential, or may be connected through separate leads to the same source of potential, for example ground potential. In this way, the first and second isolation regions may be biased substantially independently of each other, and a common ground impedance associated with the first and second isolation regions can be avoided. This is advantageous when the first surface region comprises regions of circuit elements associated with the input of the circuit and the second isolation region comprises regions of circuit elements associated with the output of the circuit, since, in this way input and output portions of the circuit can be mutually isolated substantially independently of each other.

In other integrated circuits according to the invention, the first and second electrical connections may be connected to the same source of potential, for example through a common header terminal pin, or they may be interconnected and form part of a common metal layer connection. The separation and spacing between the first and second isolation regions results in a more versatile physical layout for the integrated circuit, compared with known integrated circuits having a single common isolation region, since various circuit elements, particularly passive circuit elements such as resistors, may be arranged in the additional space between the isolation regions. However, in most cases the resulting integrated circuit would be somewhat larger than the corresponding known integrated circuit having a single common isolation region.

The structure can be used in integrated circuits in which the semiconductor layer portion is mounted on a support which either is of an insulating material such as a glass support or has an insulating nature adjacent the semiconductor layer portion such as a polycrystalline silicon support with an insulating silica surface layer. In this case, the first and second separated and mutually spaced isolation regions are also mutually electrically insulated, and it is possible for the first and second isolation regions to be biased wholly independently of each other and for them to be entirely electrically isolated.

However, the invention can be particularly advantageous for semiconductor integrated circuits having a semiconductor substrate with p - n junction isolation and operating at high frequencies or high gain. In this case, since the input and output portions of the circuit can be mutually isolated substantially independently of each other by connecting the first and second isolation regions separately to a source of potential, it is possible to substantially reduce such undesirable feedback from output to input as results from currents associated with stray capacitances of output circuit elements and as was discussed in connection with the integrated circuit of FIGS. 5 and 6. Consequently, in one semiconductor integrated circuit according to the first aspect of the invention, the semiconductor layer portion is an epitaxial layer on a semiconductor substrate of the opposite conductivity type, the first and second isolation regions and at least the first surface region extending throughout the thickness of the layer from said one surface to the interface between the layer and the substrate.

In this case, when both the first and second isolation regions extend throughout the thickness of the layer to the said interface, these isolation regions, though still separate and mutually spaced, are electrically interconnected by the substrate. Consequently, if it is desired to treat the isolation regions as substantially electrically independent and to provide separate potential source connections, the use of a highly conducting substrate should be avoided. Devices with a substrate resistivity of, for example, 1 ohm-cm could be made. However, in a preferred form, the resistivity of the semiconductor substrate is at least 10 ohm-cm or even 20 ohm-cm. In one form, the second surface region extends throughout the thickness of the layer and comprises emitter, base and collector regions of a transistor element contacted at said one surface by emitter, base and collector electrodes respectively. In another form, the second surface region is wholly of the one conductivity type, is surrounded except at said one surface by the second isolation region of the opposite conductivity type, and is contacted at the said one surface by at least one electrical connection to form at least part of a passive circuit element of the integrated circuit. The passive circuit element may be a capacitor the value of which is determined by the capacitance associated with the p - n junction between the second surface region of the one conductivity type and the isolation region of the opposite conductivity type; in this case, said second electrical connection contacting the second isolation region may act as the second electrical connection of the capacitor. When the second surface region of the one conductivity type is contacted at said one surface by two mutually spaced electrical connections, the passive circuit element may be a resistor, the value of which is determined by the resistance of the second surface region between the two spaced connections.

At said one surface, the second surface region may be in the form of a semiconductor island bounded by the second isolation region in the form of a closed figure and the first surface region may surround the second isolation region to mutually separate the first and second isolation regions.

The first isolation region may be situated towards the periphery of the layer portion.

At said one surface the first surface region may surround a third semiconductor isolation region of the said opposite conductivity type which bounds a third semiconductor surface region mainly of the one conductivity type, the third isolation region being separated and spaced from the first and second isolation regions.

Furthermore, at said one surface, the second isolation region may be in the form of a closed figure that bounds and mutually separates the second surface region and further semiconductor surface regions, and the first isolation region may be in the form of a closed figure that bounds and mutually separates the first semiconductor surface region and other surface regions.

The semiconductor integrated circuit may comprise a high frequency multi-stage amplifier.

According to a second aspect of the invention, a circuit arrangement comprises a semiconductor integrated circuit according to the first aspect of the invention, and means to apply to the said first and second electrical connections suitable potential to reverse-bias p - n junctions between the surface regions and the isolation regions. In many such circuit arrangements, it is convenient to apply ground potential to the first and second electrical connections.

The provision of first and second electrical connections for the first and second isolation regions respectively, permits separate biasing of the first and second isolation regions by separate connection of the first and second electrical connections to a source of potential.

Embodiments of the invention will now be described, by way of example, with reference to the accompanying diagrammatic drawings, in which.

Figure 1:
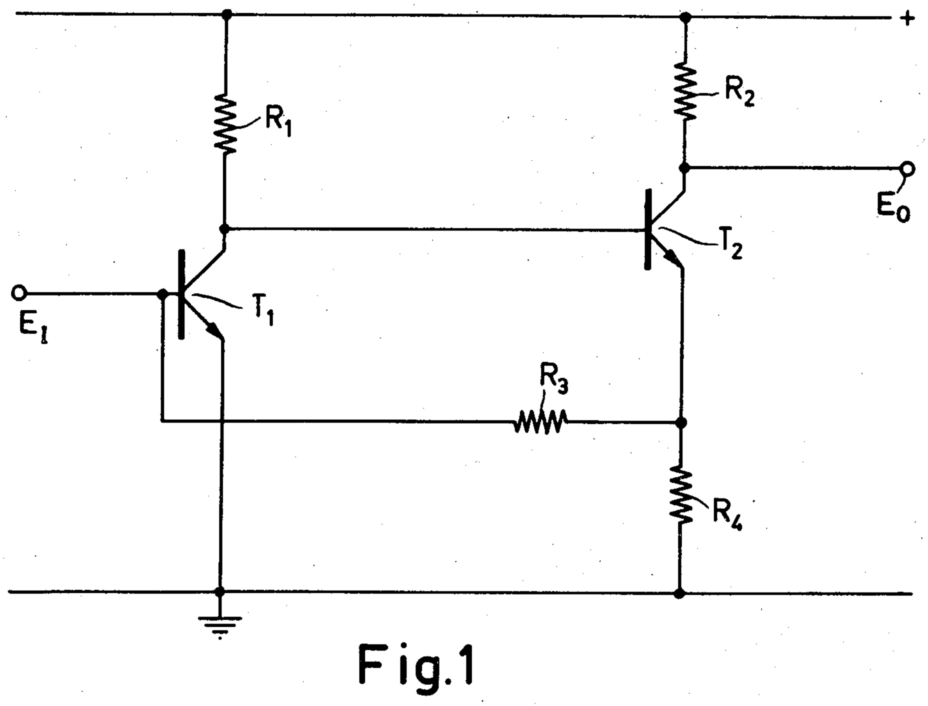
Figure 5:
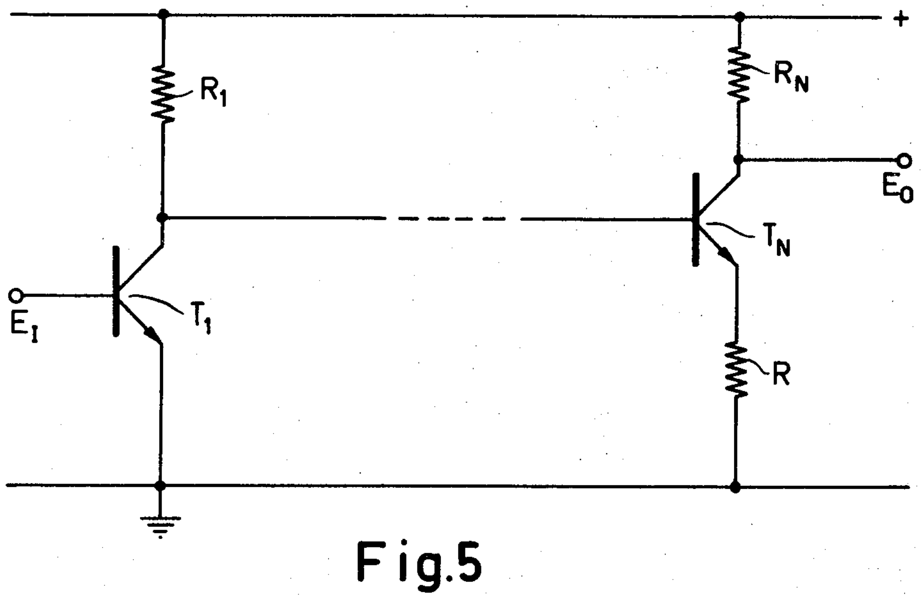
Figure 2:
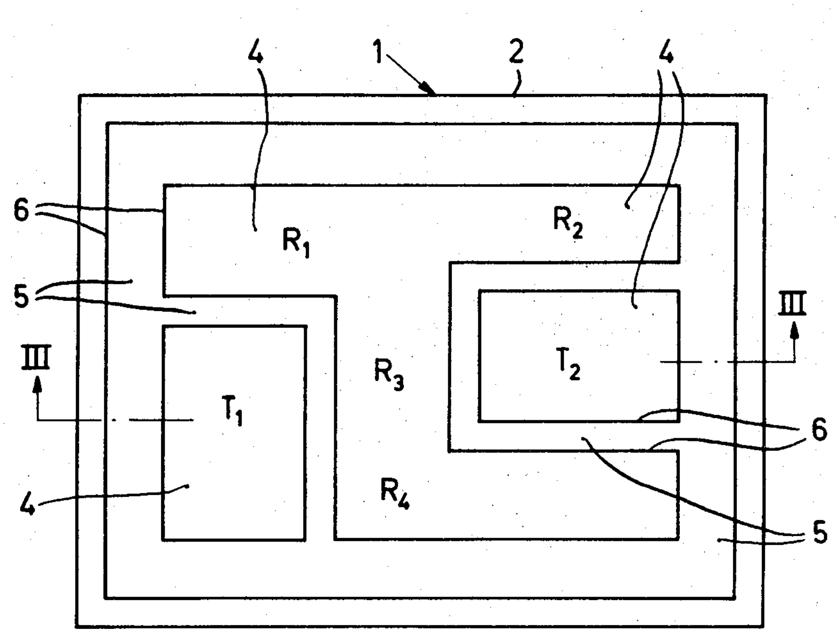
Figure 3:
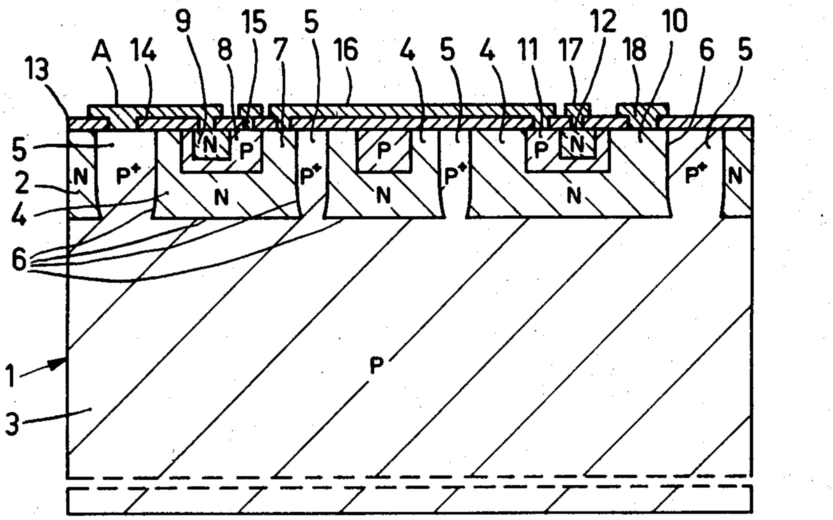
Figure 4:
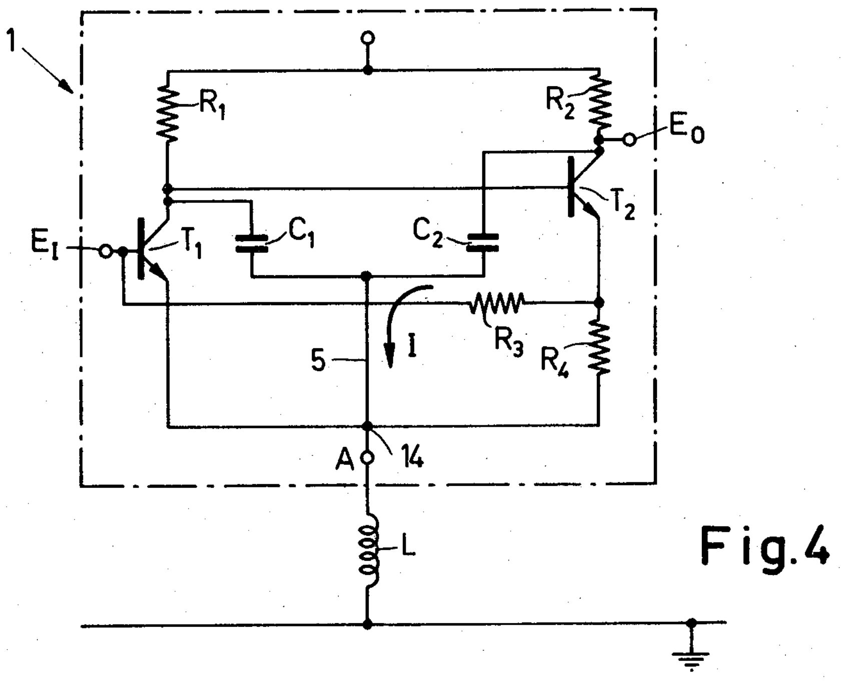
Figure 7:
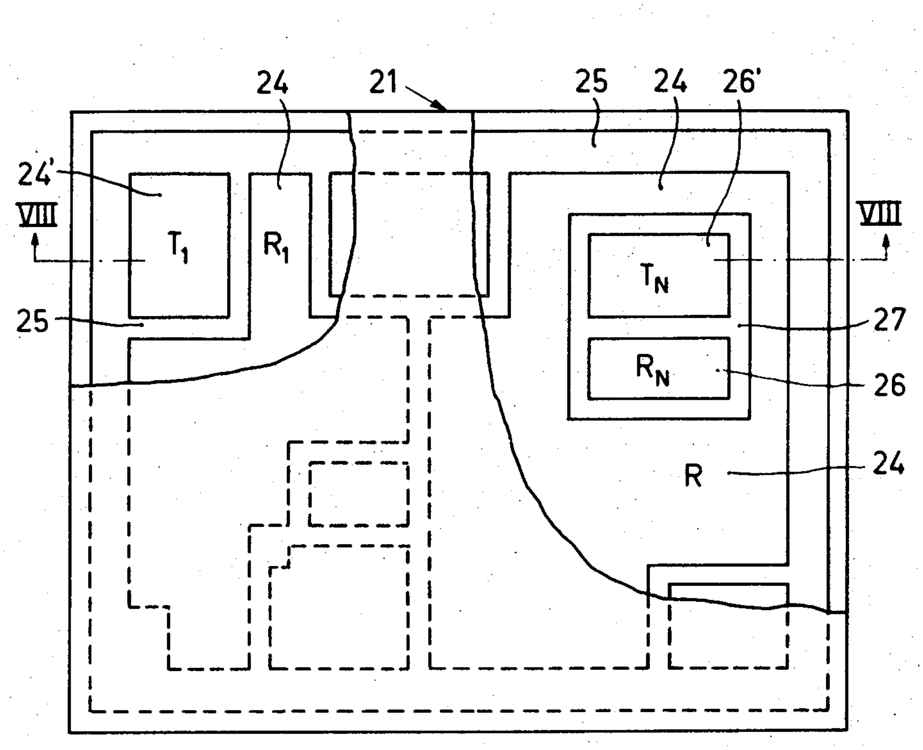
FIG. 7 is a plan view showing two portions of a first semiconductor integrated circuit in accordance with the invention.
Figure 8:
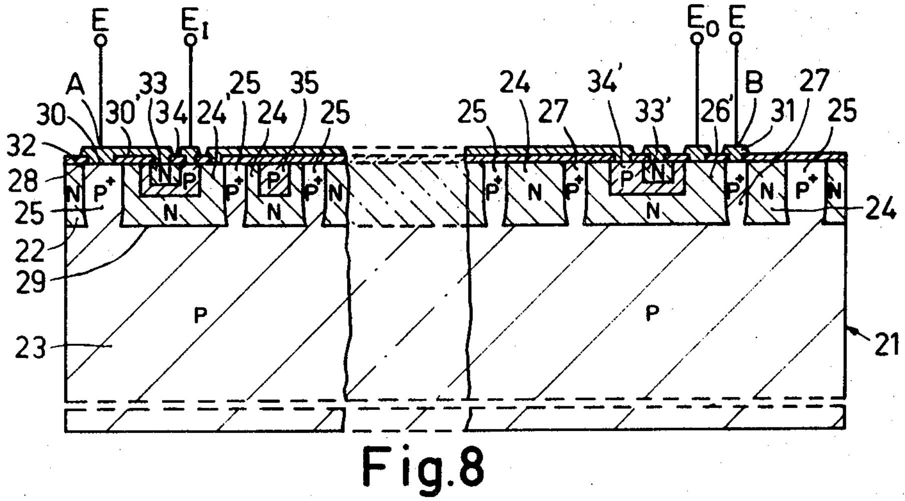
FIG. 8 is a cross-sectional view of the portions of the integrated circuit of FIG. 7.

The semiconductor integrated circuit of FIGS. 7 and 8 is an integrated form of the high frequency multi-stage amplifier circuit of FIG. 5 and comprises a monocrystalline silicon body 21 having an epitaxial layer portion 22 on a high resistivity p - type substrate 23. The layer portion 22 is divided into several surface regions which are mainly of n - type and, as indicated in FIG. 7 and shown in FIG. 8, these surface regions include semiconductor regions of the circuit elements of FIG. 5. In particular, the resistors $R_1$ and R are provided in the first surface regions 24, and the resistor $R_N$ in a second surface region 26. The input transistor $T_1$ is provided in another surface region 24′ and the output transistor $T_N$ in a further surface region 26′.

Both active and passive circuit elements associated with intermediate stages of the multi-stage amplifier are provided in surface regions of the layer portion 2 mainly of the n - type conductivity which are not shown in the drawings. These surface regions and said first and said other surface regions 24 and 24′ are bounded and mutually separated by a first p - type isolation region 25 in the form of a closed figure.

A second p - type isolation region 27 also in the form of a closed figure bounds and mutually separates said second and said further surface regions 26 and 26′. These first and second isolation regions 25 and 27 are separate and mutually spaced and extend throughout the thickness of the layer portion 22 from one surface 28 of the layer portion to the interface 29 between the layer portion 22 and the substrate 23. The first surface region 24 comprising the resistor R surrounds the second isolation region 27 to mutually separate the first and second isolation regions 25 and 27 respectively. The first isolation region 25 is situated towards the periphery of the layer portion 22 so that the edges of the layer portion 22 may be isolated from the surface regions comprising the circuit elements; consequently, the surface regions 24, 24′, 26 and 26′ have the form of semiconductor surface islands mainly of n - type conductivity surrounded in the semiconductor body 21 by the p - type substrate 23 and isolation regions 25 and 27.

A first electrical connection 30 contacts the first isolation region 25 at said one surface 28, and a second electrical connection 31 contacts the second isolation region 27 also at the said one surface 28. In operation of the circuit, suitable potentials are applied to the first and second electrical connections 30 and 31 respectively to reverse-bias p - n junctions between the isolation regions 25 and 27 and the surface regions comprising the circuit elements, and so mutually electrically isolate these surface regions, for example the surface regions 24, 24′, 26 and 26′. In this form of integrated structure having p - type isolation regions, it is desirable to connect the isolation regions 25 and 37 to the most negative, stable potential in the circuit, which in the circuit of FIG. 5 is ground potential. In addition, the emitter of input transistor $T_1$ is to be connected to ground potential.

As shown in FIG . 8, the first electrical connection 30 contacting the first isolation region 25 forms part of a metal layer connection 30′ provided on a silica layer 32 on said one surface 28. Through openings in the silica layer 32, this metal layer connection 30′ contacts the first isolation region 25 and the emitter region 33 of the input transistor $T_1$. The metal layer connection 30′ also has an expanded contact area A situated over part of the isolation region 25 and towards the periphery of the said portion 22. To this expanded contact area A an external conductor may be bonded. Through a common lead $L_1$ comprising this external conductor and possibly a header terminal pin, the metal layer connection 30′ is connected, in operation of the circuit, to a first source of ground potential E which consequently is applied to both the first isolation region 25 and the emitter region 33.

A second, separate metal layer connection provided on the silica layer 32 forms the second electrical connection 31 and contacts the second isolation region 27 through an opening in the silica layer 32. This metal layer connection has an expanded contact area B to which an external conductor may be bonded, so providing another lead $L_2$ through which the second isolation region 27 can be connected separately to the source of ground potential E.

In this way, the first isolation region 25 associated with the input stage of the circuit and the second isolation region 27 associated with the output stage of the circuit may be independently biased, and the majority of the circuit I associated with the collector-substrate capacitance $C_N$ of the output transistor $T_N$ will flow to ground E through the second electrical connection 31 and the lead $L_2$, rather than effect feed-back from the output stage to the input stage of the circuit.

It should be noted however, that a small percentage of the capacitive current I still flows to the input stage. This results from the interconnection of the first and second isolation regions by the substrate 23. This interconnection is illustrated as an equivalent circuit in FIG. 9 in terms of the substrate bulk resistance $R_S$ connecting the isolation regions 25 and 27 and connected to the collector-substrate capacitance $C_N$ of the output transistor $T_N$. Furthermore, when the circuit is mounted, for example on a header, the substrate 23 may be bonded to part of the header to form a back contact to the substrate 23; this back contact may be connected to the header terminal pin to which is connected the first electrical connection 30 which contacts the first isolation region 25.

However, it is found that by avoiding the use of a highly conducting substrate, the electrical resistance between the first and second isolation systems can be high enough for their consideration as substantially electrically independent and for provision of separate ground connections. For this reason, the p - type substrate 23 has a comparatively high resistivity, for example a value in the range 1 – 20 ohm-cm. A typical value for the resistivity of the p - type substrate is 10 ohm-cm, which corresponds to an acceptor impurity concentration of $1.4 \times 10^{15}$ atoms/c.c. The percentage of capacitive current I flowing to the input also depends on the relative dimensions of the integrated structure. In the device of FIGS. 7 and 8, the substrate 23 has a thickness of 150 microns and the thickness of the epitaxial layer 22 throughout which the isolation regions 25 and 27 extend is 10 microns. The width of the surface island region 26' which comprises the output transistor $T_N$ is 100 microns, and the width of the second isolation region 27 that bounds the surface island regions 26' and 26 is 40 microns.

Figure 6:
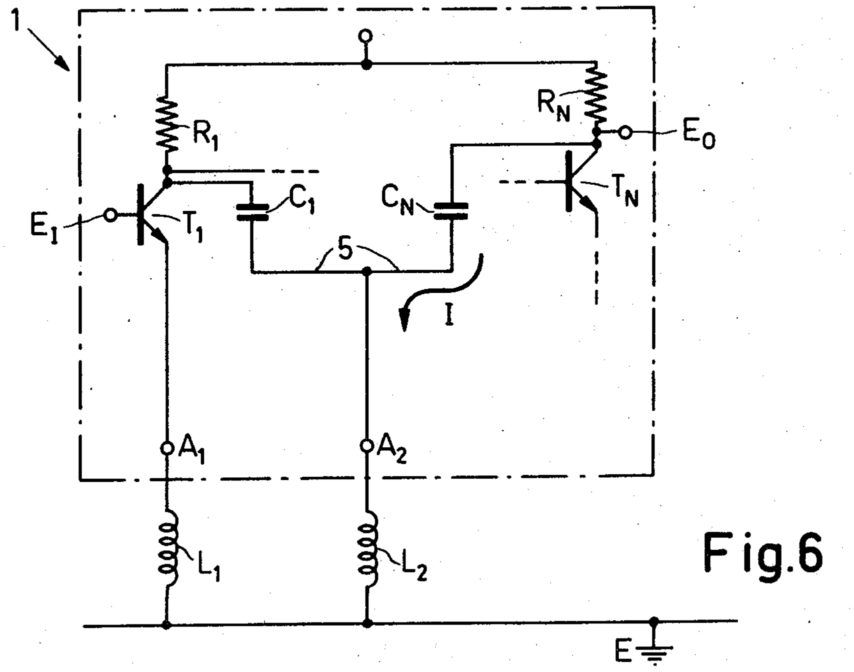
Figure 9:
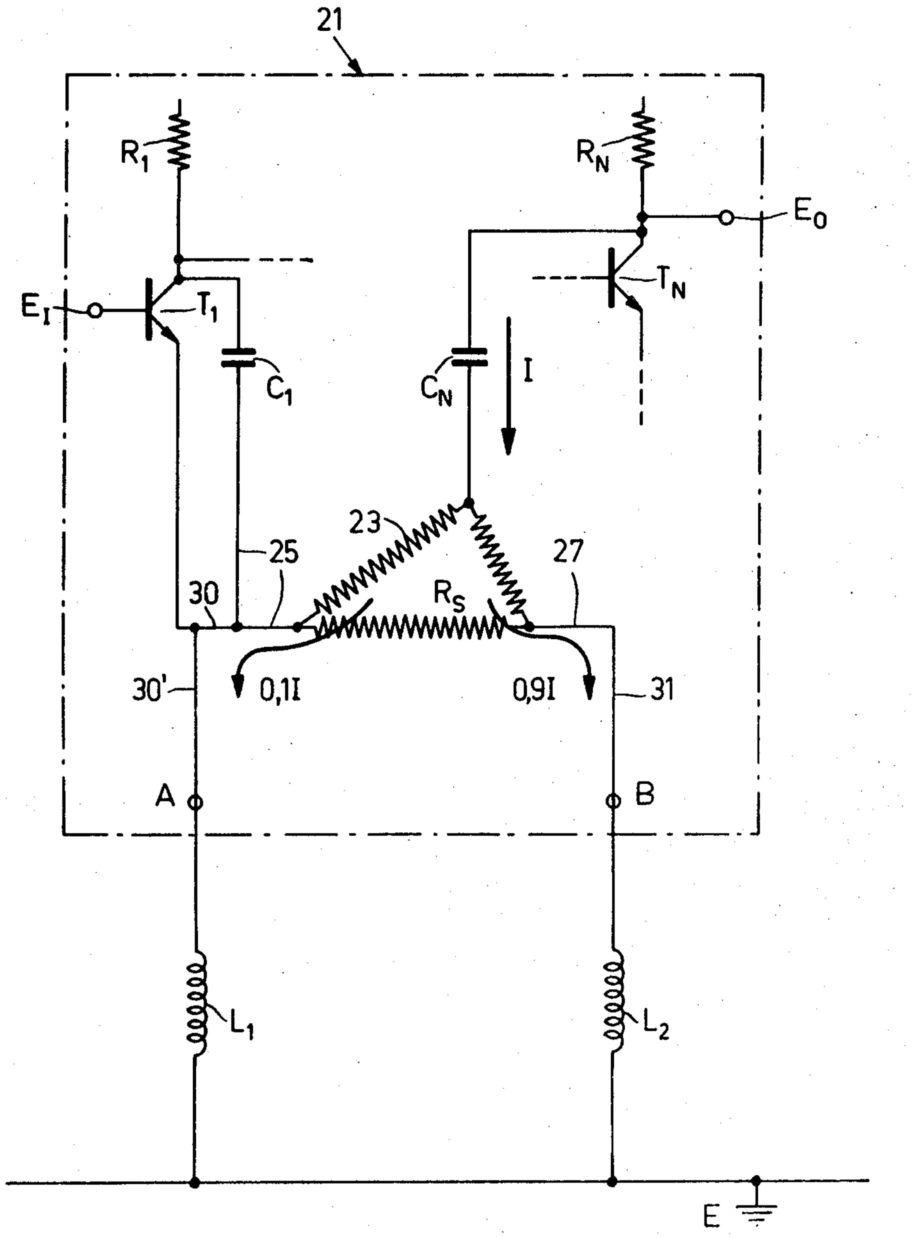
FIG. 9 is a circuit diagram showing capacitive couplings and connections in the integrated circuit of FIGS. 7 and 8.

In this manner, by choice of the substrate resistivity and the relative dimensions of the structure, integrated circuits have been manufactured in which 90 percent of the capacitive current I associated with the said collector-substrate capacitance $C_N$ flows to ground through the second electrical connection 31 and the second lead $L_2$, and only 10 percent of the said current is fed back to the circuit input. Consequently the troublesome feed-back associated with the integrated circuit illustrated in FIG. 6 is substantially reduced. This is illustrated in FIG. 9, where the major portion of the resistance $R_S$ forms part of the current path to the contact area A and the lead $L_1$.

The semiconductor regions of the various circuit elements, the silica layer 32 and the metal layer connections and contact areas are not shown in FIG. 7 for the sake of clarity.

However, as shown in FIG. 8, the transistors $T_1$ and $T_N$ have emitter regions 33 and 33' respectively and base regions 34 and 34' respectively. Portions of the surface island regions 24' and 26' surrounding the base regions 34 and 34' form the collector regions of the transistors $T_1$ and $T_N$ respectively. As is known, the collector series resistance of each transistor may be reduced by the presence of a high conductivity n - type buried layer at the interface between each surface island region and the substrate, and a high conductivity n - type contact region extending from the surface 28 and contacted by a collector electrode forming part of a metal layer connection. Input signals $E_I$ are applied to the circuit through an external conductor bonded to an expanded contact area of the metal layer connection which contacts the base region 34 of the input transistor $T_1$. Output signals $E_O$ of the circuit are derived from an external conductor bonded to an expanded contact area of the metal layer connection forming the collector electrode of the output transistor $T_N$.

The resistors $R_N$, and $R_1$ and R comprise p - type semiconductor surface regions in the semiconductor surface island regions 26 and 24 respectively and are contacted through openings in the silica layer 32 by metal layer connections that interconnect the resistors with the transistors to form the circuit of FIG. 5. In the cross-sectional view of FIG. 8, the semiconductor surface region 35 of resistor $R_1$ is shown.

The conductivity type determining impurity concentration, the configuration and the dimensions of the various semiconductor regions are chosen in accordance with the desired characteristics of the circuit elements. In particular, the epitaxial layer 22 may have a resistivity in the range 0.1 to 10 ohm-cm., a typical value being 0.5 ohm-cm. corresponding to a donor impurity concentration of $1.2 \times 10^{16}$ atoms/c.c. The p - type isolation regions 25 and 27 have a higher conductivity and at the surface 28 of the layer 22 their acceptor impurity concentration may be in the range $10^{17}$ to $10^{18}$ atoms/c.c. For this reason they are designated $P^+$ in the drawings.

Figure 10:
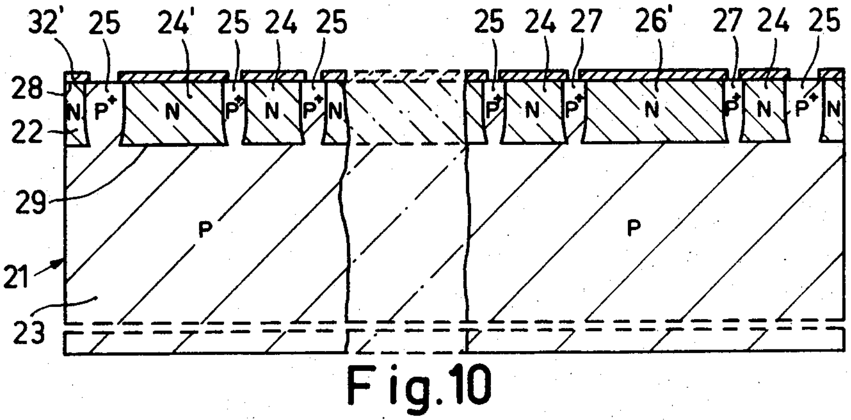
FIG. 10 is a cross-sectional view of portions of the semiconductor body of the integrated circuit of FIGS. 7 and 8 during its manufacture.

The integrated circuit of FIGS. 7 and 8 is manufactured in the following manner starting with the p - type substrate 23 which forms part of a p - type silicon wafer having a resistivity of 10 ohm-cm. A large number of identical integrated circuits are manufactured in an array on the wafer, the final structure of which is subsequently divided to form separate integrated circuits. However, FIG. 10 shows only the semiconductor body 21 of one such circuit, and it will be in relation to the semiconductor body 21 and the substrate 23 of one circuit, rather than the whole wafer, that the various stages of manufacture will be described.

Opposite surfaces of the substrate 23 (which form part of the opposite major surfaces of the waver) are cleaned and polished. On one of the surfaces the n - type silicon epitaxial layer 22 is grown to a thickness of 10 microns, being deposited by chemical reaction from the gas phase with a phosphorus impurity concentration of $1.2 \times 10^{16}$ atoms/c.c. In this manner, the n - type layer 22 of resistivity 0.5 ohm-cm. is formed on the p - type substrate 23. If it is desired to incorporate high conductivity n - type buried layers at the interface 29 to reduce collector series resistance of transistors of the integrated circuit, for example transistors $T_1$ and $T_N$ in the islands 24' and 26' respectively, arsenic deposits may be provided selectively at the said one surface prior to the growth thereon of the layer 22. Such deposits would have a high surface concentration of, for example, $10^{21}$ atoms/c.c.

A comparatively thin silica layer 32' is grown over the whole of the free surface 28 of the n - type layer 22 on the p - type substrate 23. In a known way, using photolithographic and etching techniques, openings are formed in the silica layer 32' to expose certain portions of the layer surface 28, as shown in FIG. 7. The isolation regions 25 and 27 are then formed by a deep boron diffusion, comprising a deposition stage and a drive-in stage; through openings in the silica layer 32', a high concentration of boron is selectively deposited on the surface 28, and then at a higher temperature the boron is driven into the layer 22, by diffusion, to form the p - type isolation regions 25 and 27 extending throughout the thickness of the layer 22 (see FIG. 10). The configuration of the openings in the silica layer 32' determine the configuration of the isolation regions 25 and 27 and are such that the isolation regions 25 and 27 so formed are separate and mutually spaced as described hereinbefore.

Instead of forming the isolation regions 25 and 27 wholly by boron diffusion from the free surface 28 of the layer 22, boron diffusion from both the surface 28 and the interface 29 may be employed. In this case, first boron deposits are provided selectively at the said one surface of the substrate 23 prior to the growth thereon of the layer 22. Further boron deposits are provided on portions of the free surface 28 of the epitaxial layer 22 in alignment with the first boron deposits. During the subsequent diffusion treatment, the first and further boron deposits diffuse into the layer 22 from opposite surfaces and combine to form the isolation regions 25 and 27. At a given diffusion furnace temperature, such a procedure reduces the diffusion time required to form the isolation regions and also reduces the width of the isolation regions 25 and 27 so formed.

Arsenic diffuses more slowly than boron, so that while the boron deposit or deposits diffuse throughout the thickness of the epitaxial layer 22, n - type buried layers formed by arsenic diffusion from the interface 29 would remain comparatively thin.

The p - type isolation regions 25 and 27 divide the n - type epitaxial layer 22 into mutually isolated surface island regions for example surface island regions 24, 24', 26 and 26' of the silicon body 21. Portions of the resulting structure are shown in cross-sectional view in FIG. 10. In these surface island regions, the semiconductor regions of the various circuit elements are formed in the conventional manner by selective impurity diffusion from the surface 28 using silica layer masking.

The p - type semiconductor regions of the resistors (for example the p - type region 35 of resistor $R_1$) are formed by boron diffusion simultaneously with the p - type base regions of the n-p-n transistors, for example base regions 34 and 34' of the transistors $T_1$ and $T_N$ respectively. The n - type emitter regions of the transistors are formed within the base regions by phosphorus diffusion. The base-collector p - n junctions extend to a depth below the surface 28 in the range 2.5 to 3 microns and the emitter-base junctions to a depth of approximately 2 microns.

Openings are then formed in the silica layer 32 on the surface 28 to expose portions of the various semiconductor regions, and a thin film of aluminum is deposited over the silica layer 32 and the exposed silicon region portions. Using photo-resist masking techniques, the aluminum film is selectively etched, for example with sodium hydroxide, to form the separate metal layer connections which contact the various semiconductor region portions, interconnect the circuit elements and have expanded contact areas for connection thereto of external conductors (for example metal layer connections 30' and 31 with contact areas A and B respectively).

Figures 11, 12:
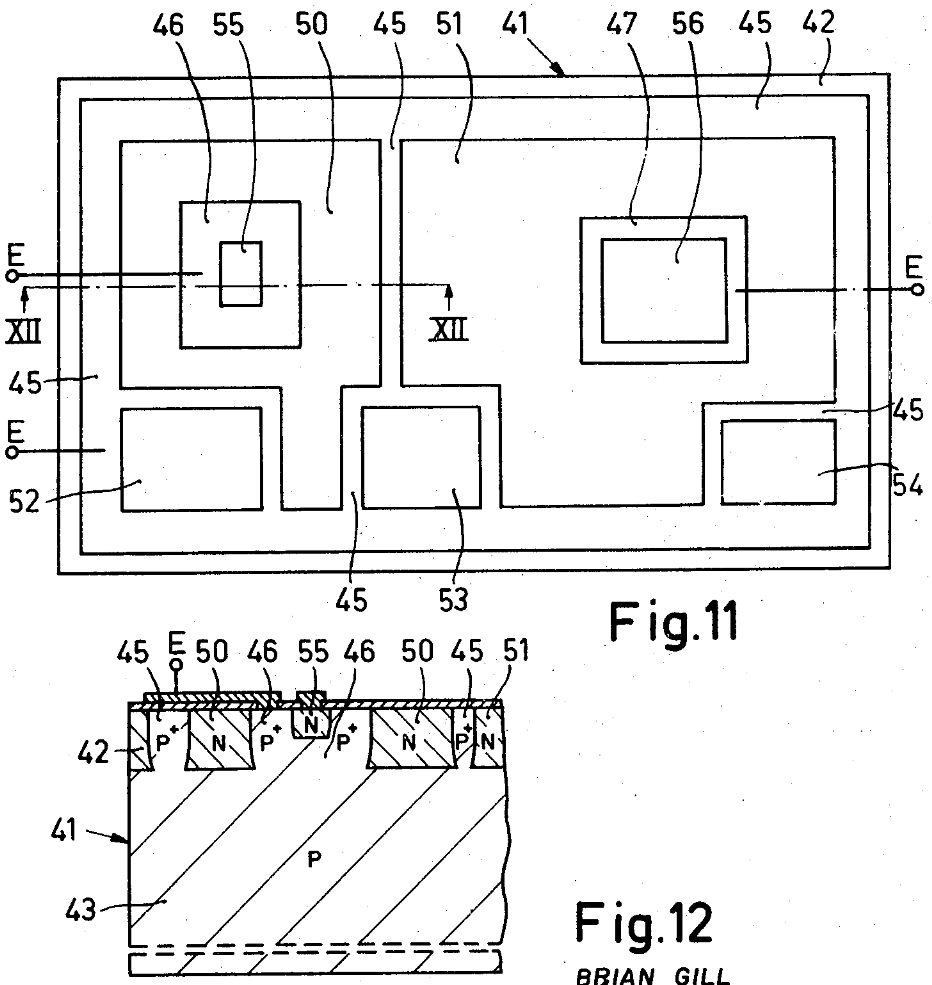
FIG. 11 is a plan view of a second semiconductor integrated circuit in accordance with the invention.
FIG. 12 is a cross-section on the line XII — XII of FIG. 11.

FIG. 11 illustrates in plan view the isolation region structure of a second semiconductor integrated circuit in accordance with the invention. This integrated circuit comprises a silicon layer portion 42 with separate and mutually spaced p - type isolation regions 45, 46 and 47 extending throughout the thickness of the layer 42 and mutually isolating surface island regions 50 to 56 inclusive of the layer portion 42. The layer portion 42 is an epitaxial layer on a high resistivity p - type substrate 43 (as shown in FIG. 12). The surface island regions 50 to 56 inclusive are mainly of the n - type and include semiconductor regions of various circuit elements. Isolation region 45 extends towards the periphery of the layer 42 to mutually isolate the edges of the layer 42 and the surface island regions and bounds and mutually separates surface island regions 50 to 54 inclusive. Surface island region 51 surrounds the isolation region 47 which bounds the surface island region 56; similarly surface island region 50 surrounds the isolation region 46 which bounds the surface island region 55. The isolation regions 45, 46 and 47 have separate electrical connections to a source of ground potential E shown symbolically in FIG. 11. In this manner, the isolation regions 45, 46 and 47 may be biased substantially independently to provide p - n junction isolation between surface island regions 50 to 56 inclusive.

The surface island regions 55, 50 and 52 comprise regions of circuit elements associated with the input stage of the circuit, and the islands 56, 51 and 54 comprise regions of circuit elements associated with the output stage of the circuit. Regions of circuit elements associated with the intermediate stages of the circuit are provided in the surface islands 53, 50 and 51. In particular, the island region 56 comprises regions of an output transistor, and the island region 55 forms part of a capacitor associated with the input stage. The island region 55 is wholly of the n - type, is surrounded except at the surface by the p - type isolation region 46 and is contacted at the surface by one electrical connection, which is one connection of the capacitor; the other connection of the capacitor is the electrical connection contacting the isolation region 46. The value of the capacitor is determined by the capacitance associated with the p - n junction between the n - type surface island region 55 and the p - type isolation region 46. Consequently, the isolation region 46 has the form of a p - type pedestal extending from the p - type substrate 43 to the surface of the layer 42 with the n - type surface island region 55 provided in the pedestal at the said surface.

Such a structure permits independent biasing of the isolation regions 45, 46 and 47 through separate leads, so that capacitive current feed-back from the output stage, particularly the output transistor in the island region 56, to the input stage, particularly the capacitor associated with the island 55, is substantially reduced.

The integrated circuit of FIGS. 11 and 12 is manufactured in a manner similar to that for the integrated circuit of FIGS. 5, 7 and 8.

A more complex but similar integrated structure has been made comprising an I-F (intermediate frequency) video amplifier for a television receiver, and was successful in substantially reducing undesirable capacitive feed-back from the output stage of the video amplifier to the input stage.

Many modifications are possible within the scope of the invention defined in the appended claims. In a structure similar to that of FIGS. 11 and 12, the portion of the isolation region 45 mutually separating surface island regions 50 and 51 need not be present, in which case the two regions 50 and 51 form a single surface island region 50, 51 which surrounds the isolation region 47 bounding the surface island region 56 and also surrounds the isolation region 46 bounding the surface island region 55. In this case, the isolation region 47 is separated and spaced from the isolation region 46 and from the isolation region 45 by the surface island region 50, 51. Furthermore, no electrical connection need be provided to the isolation region 45 at the top surface of the layer 42, in which case the regions 46 and 47 would form first and second isolation regions contacted at said top surface by first and second electrical connections.

Regions of passive circuit elements may be provided not only in the surface island regions, but also in the isolation regions surrounding these island regions.

An important modification is where the conductivity type of the various semiconductor regions and portions of the integrated circuit are the opposite of those described, namely the isolation regions are of the n - type, the surface regions are mainly p - type and the substrate is of the n - type. In this case, the most positive, stable potentials in the circuit can be applied to the electrical connections contacting isolation regions to reverse-bias p - n junctions between the isolation regions and the surface island regions; the n - type isolation regions can be formed by a phosphorus diffusion.

It will be appreciated that semiconductor materials other than silicon may be used.

What we claim is:

1. A semiconductor integrated circuit device for high frequency operation, comprising a substrate, a semiconductor layer portion on the substrate, first and second semiconductor surface regions of the layer portion, said first and said second surface regions being mainly of one conductivity type and comprising regions of circuit elements of the integrated circuit, a first semiconductor isolation region bounding the first surface region, a second semiconductor isolation region bounding the second surface region, said first and said second isolation regions being of the opposite conductivity type, extending into said layer portion from the surface thereof, and being separate and mutually spaced from each other, a first electrical connection on the first isolation region at the surface thereof, a second electrical connection contacting the second isolation region at the surface thereof, and means to isolate the circuit elements in the first and the second surface portions from each other at the frequency of operation of the integrated circuit, said isolation means comprising first circuit means for applying a potential to the first electrical connection to reverse bias the first isolation region with respect to the layer portion and second circuit means for applying a potential to the second electrical connection to reverse bias the second isolation region with respect to the layer portion, said first and said second circuit means having separate circuits.

2. A semiconductor integrated circuit device as claimed in claim 1 wherein the first surface region includes circuit elements associated with the input portion of the integrated circuit and the second surface region includes circuit elements associated with the output portion of the integrated circuit.

3. A semiconductor integrated circuit device as claimed in claim 2 wherein the semiconductor layer portion is an epitaxial layer and the substrate is a semiconductor body of the opposite conductivity type, said first and said second isolation regions and at least said first surface region extending through the thickness of said epitaxial layer from the surface thereof to the interface between said epitaxial layer and said substrate.

4. A semiconductor integrated circuit device as claimed in claim 3 wherein the resistivity of the semiconductor body is at least 10 ohm-cm.

5. A semiconductor integrated circuit device as claimed in claim 3 wherein the second surface region extends throughout the thickness of the epitaxial layer and comprises emitter, base and collector regions of a transistor element contacted at the surface by emitter, base and collector electrodes, respectively.

6. A semiconductor integrated circuit device as claimed in claim 1 wherein the second surface region is in the form of a semiconductor island, the second isolation region forms a closed figure and the first surface region surrounds the second isolation region to mutually separate the first and the second isolation regions.

7. A semiconductor integrated circuit device as claimed in claim 1 wherein the first isolation region is situated at the periphery of the layer portion.

8. A semiconductor integrated circuit device as claimed in claim 1 further comprising a third surface region mainly of the one conductivity type and a third semiconductor isolation region of opposite conductivity type, said third isolation region bounding said third surface region and being separated and spaced from said first and said second isolation regions.

9. A semiconductor integrated circuit device as claimed in claim 8 wherein the second isolation region is in the form of a closed figure that bounds and mutually separates the second surface region from said first and said third surface regions.

10. A semiconductor integrated circuit device as claimed in claim 9 wherein a first isolation region is in the form of a closed figure that bounds and mutually separates the first surface region from the second and the third surface regions.

11. A semiconductor integrated circuit device as claimed in claim 1 wherein said integrated circuit comprises a high frequency multistage amplifier.

12. A semiconductor integrated circuit device as claimed in claim 1 wherein the first and the second electrical connections are at ground potential.

13. A semiconductor integrated circuit device as claimed in claim 1 wherein the first and the second electrical connections are connected to separate sources of potential.

* * * * *

PO-1050
(5/69)

UNITED STATES PATENT OFFICE
CERTIFICATE OF CORRECTION

Patent No. 3,688,132 Dated August 29, 1972

Inventor(s) BRIAN GILL ET AL

It is certified that error appears in the above-identified patent and that said Letters Patent are hereby corrected as shown below:

Column 8, line 4, change "37" to --27--.

Claim 3, should depend on Claim 1.

Signed and sealed this 8th day of May 1973.

(SEAL)
Attest:

EDWARD M.FLETCHER,JR.
Attesting Officer

ROBERT GOTTSCHALK
Commissioner of Patents